(12) United States Patent
Song et al.

(10) Patent No.: US 8,054,693 B2
(45) Date of Patent: Nov. 8, 2011

(54) CAPACITORLESS DYNAMIC MEMORY DEVICE CAPABLE OF PERFORMING DATA READ/RESTORATION AND METHOD FOR OPERATING THE SAME

(75) Inventors: Ki-Whan Song, Yongin-si (KR); Nam-Kyun Tak, Bucheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 127 days.

(21) Appl. No.: 12/654,283

(22) Filed: Dec. 16, 2009

(65) Prior Publication Data
US 2010/0149886 A1 Jun. 17, 2010

(30) Foreign Application Priority Data
Dec. 17, 2008 (KR) .................. 10-2008-0128772

(51) Int. Cl.
*G11C 16/04* (2006.01)
(52) U.S. Cl. ......... 365/185.25; 365/185.26; 365/185.19; 365/185.18; 365/185.02; 365/185.03
(58) Field of Classification Search ............ 365/185.02, 365/185.03, 185.06, 185.19, 185.18, 185.25, 365/185.26
See application file for complete search history.

(56) References Cited

U.S. PATENT DOCUMENTS

| | | | |
|---|---|---|---|
| 5,146,152 A | 9/1992 | Jin et al. | |
| 5,953,263 A | 9/1999 | Farmwald et al. | |
| 5,998,840 A | 12/1999 | Kim | |
| 6,055,183 A | 4/2000 | Ho et al. | |
| 6,060,750 A | 5/2000 | Hisamoto et al. | |
| 6,084,812 A | 7/2000 | Joo | |

(Continued)

FOREIGN PATENT DOCUMENTS
JP 04-366492 A 12/1992
(Continued)

OTHER PUBLICATIONS

Ota et al., "Novel Locally Strained Channel Technique for High Performance 55nm CMOS," IEEE 2002, pp. 27-30.

(Continued)

*Primary Examiner* — Andrew Q Tran
(74) *Attorney, Agent, or Firm* — Harness, Dickey & Pierce, P.L.C.

(57) ABSTRACT

In example embodiments, the semiconductor memory device, and the method for operating the semiconductor memory device, includes a memory cell array having a plurality of memory cells each formed of a transistor having a floating body. The transistors are coupled between a plurality of word lines, a plurality of source lines and a plurality of bit lines. Additionally, the memory cell array includes a controller configured to read data from at least one of the memory cells and restore data to the memory cell storing a first data state through a bit operation of the memory cell. The controller restores data to the memory cell by applying a first source-line control voltage to a selected source line and applying a first word-line control voltage to a selected word line in a first period of a read operation. Also, the controller is configured to restore data to the memory cell, which is storing a second data state, by applying a second source-line control voltage to the selected source line and applying a second word-line control voltage to the selected word line in a second period of the read operation.

30 Claims, 7 Drawing Sheets

U.S. PATENT DOCUMENTS

| | | | |
|---|---|---|---|
| 6,147,903 | A | 11/2000 | Takahashi |
| 6,475,890 | B1 | 11/2002 | Yu |
| 6,567,330 | B2 | 5/2003 | Fujita et al. |
| 6,621,725 | B2 | 9/2003 | Ohsawa |
| 6,697,909 | B1 | 2/2004 | Wang et al. |
| 6,723,638 | B1 | 4/2004 | He et al. |
| 6,826,074 | B2 | 11/2004 | Yamauchi |
| 6,861,689 | B2 | 3/2005 | Burnett |
| 6,861,889 | B2 | 3/2005 | Tobita |
| 6,882,008 | B1 | 4/2005 | Ohsawa |
| 6,982,918 | B2 | 1/2006 | Fazan et al. |
| 7,035,147 | B2 * | 4/2006 | Yeh et al. ............... 365/185.29 |
| 7,064,973 | B2 | 6/2006 | Peng et al. |
| 7,075,151 | B2 | 7/2006 | Shino |
| 7,098,507 | B2 | 8/2006 | Tang et al. |
| 7,154,788 | B2 | 12/2006 | Takemura et al. |
| 7,170,807 | B2 | 1/2007 | Fazan et al. |
| 7,187,581 | B2 | 3/2007 | Ferrant et al. |
| 7,233,536 | B2 | 6/2007 | Ogiwara et al. |
| 7,301,803 | B2 | 11/2007 | Okhonin et al. |
| 7,326,634 | B2 | 2/2008 | Lindert et al. |
| 7,338,862 | B2 | 3/2008 | Huo et al. |
| 7,436,724 | B2 | 10/2008 | Nandi |
| 7,442,988 | B2 | 10/2008 | Oh et al. |
| 7,872,840 | B1 * | 1/2011 | Vashchenko et al. ............ 361/56 |
| 7,924,644 | B2 * | 4/2011 | Park et al. .................. 365/222 |
| 2002/0057622 | A1 | 5/2002 | Sim |
| 2003/0231524 | A1 | 12/2003 | Ohsawa |
| 2004/0256683 | A1 | 12/2004 | Lee et al. |
| 2005/0026354 | A1 | 2/2005 | Bhattacharyya |
| 2005/0068807 | A1 | 3/2005 | Ohsawa |
| 2005/0180214 | A1 | 8/2005 | Park |
| 2006/0081851 | A1 | 4/2006 | Ono |
| 2006/0092739 | A1 | 5/2006 | Fujita et al. |
| 2006/0131650 | A1 | 6/2006 | Okhonin et al. |
| 2006/0138558 | A1 | 6/2006 | Morikado |
| 2006/0208301 | A1 | 9/2006 | Shino |
| 2007/0007574 | A1 | 1/2007 | Ohsawa |
| 2007/0013007 | A1 | 1/2007 | Kusunoki et al. |
| 2007/0023809 | A1 | 2/2007 | Villaret et al. |
| 2007/0051994 | A1 | 3/2007 | Song et al. |
| 2007/0058427 | A1 | 3/2007 | Okhonin et al. |
| 2007/0090443 | A1 | 4/2007 | Choi et al. |
| 2007/0091703 | A1 | 4/2007 | Nishimura et al. |
| 2007/0097751 | A1 | 5/2007 | Popoff et al. |
| 2007/0158727 | A1 | 7/2007 | Song et al. |
| 2007/0161181 | A1 | 7/2007 | Song et al. |
| 2007/0285982 | A1 | 12/2007 | Carman |
| 2008/0012439 | A1 | 1/2008 | Wu et al. |
| 2008/0130376 | A1 | 6/2008 | Park et al. |
| 2008/0278473 | A1 | 11/2008 | An |
| 2008/0284493 | A1 | 11/2008 | Baek et al. |
| 2008/0303095 | A1 | 12/2008 | Xiong et al. |
| 2010/0149886 | A1 * | 6/2010 | Song et al. ............... 365/189.15 |

FOREIGN PATENT DOCUMENTS

| | | |
|---|---|---|
| JP | 2003-031696 A | 1/2003 |
| JP | 2003-068877 A | 3/2003 |
| JP | 2003-132682 A | 5/2003 |
| JP | 2006-085812 | 3/2006 |
| JP | 2006/107560 A | 4/2006 |
| JP | 2006-108396 A | 4/2006 |
| JP | 2006-156986 A | 6/2006 |
| JP | 2006-179746 A | 7/2006 |
| JP | 2006-260722 A | 9/2006 |
| JP | 2007-018588 A | 1/2007 |
| JP | 2007-036257 A | 2/2007 |
| JP | 2007-073680 A | 3/2007 |
| KR | 10-1994-0003406 | 2/1994 |
| KR | 10-0248507 B1 | 3/2000 |
| KR | 10-2002-0014757 | 2/2002 |
| KR | 10-2003-0015823 | 2/2003 |
| KR | 10-0542161 A | 2/2003 |
| KR | 10-0429868 | 4/2004 |
| KR | 10-2005-0071665 | 7/2005 |
| KR | 10-0502374 | 7/2005 |
| KR | 10-2006-0104794 | 10/2006 |
| KR | 10-0663359 A | 10/2006 |
| KR | 10-0660910 B1 | 12/2006 |
| KR | 10-0673012 B1 | 1/2007 |
| KR | 10-0682537 B1 | 2/2007 |
| KR | 10-0699890 B1 | 3/2007 |
| KR | 10-2008-0047105 | 5/2008 |
| KR | 10-2008-0058806 | 6/2008 |

OTHER PUBLICATIONS

Cho et al., "A 6F2 DRAM Technology in 60nm era for Gigabit Densities," 2005 Symposium on VLSI Technology Digest ci Technical Papers, pp. 36-37.

Ohsawa et el., "A Memory Using One-Transistor Gain Cell on SOI(FBC) with Performance Suitable for Embedded DRAM's," 2003 Symposium on VLSI Circuits Digest of Technical Papers, pp. 93-96.

Jeong et al., "A Capacitor-less IT DRAM Cell Based on a Surrounding Gate MOSFET with a Vertical Channel," 2005 IEEE Silicon Nancelectronics Workshop, pp. 92-93.

"Capacitor-less 1T DRAM cell structure for sensing margin and retention time enhancement," 2007 The Korean Conference on Semiconductors.

"Floating Body DRAM Characteristics of Silicon-On-ONO (SOONO) Devices for System-on-Chip (SoC) Applications," 2007 Symposium on VLSI Technology Digest of Technical Papers, pp. 168-169.

ISSCC 2005, Session 25, Dynamic Memory, "An 18.5ns 128Mb SOI DRAM with a Floating Body Cell," pp. 458-459, 609.

Takashi Ohsawa et al, "Memory Design Using a One-Transistor Gain Cell on SOI" IEEE Journal of Solid-State Circuits, vol. 37, No. 11, Nov. 2002; p. 1510-1522.

US Office Action dated Apr. 6, 2010, issued in Co-Pending U.S. Appl. No. 12/171,406.

US Office Action dated Jun. 7, 2010, issued in Co-Pending U.S. Appl. No. 12/348,036.

US Office Action date Aug. 18, 2010, issued in Co-Pending U.S. Appl. No. 12/285,520.

US Office Action dated Oct. 27, 2010, issued in Co-Pending U.S. Appl. No. 12/171,406.

Office Action for corresponding U.S. Appl. No. 12/453,036 dated Jan. 3, 2011.

Mishel Matloubian et al., "Modeling of the Subthreshold Characteristics of SOI MOSFETS's with Floating Body," IEEE Transactions on Electron Devices, vol. 37, No. 9, Sep. 1990.

A 2ns Read Latency,4MB Embedded Z-Ram Floating Body Memory Macro in 45nm SOI Technology, Michel Bron et al, IEDM 2007.

55nm Capacitor-less IT DRAM Cell Transistor with Non-Overlap Structure, Ki-Whan Song et al.

* cited by examiner

CAPACITORLESS DYNAMIC MEMORY DEVICE CAPABLE OF PERFORMING DATA READ/RESTORATION AND METHOD FOR OPERATING THE SAME

PRIORITY STATEMENT

This application claims the benefit of priority under 35 U.S.C. §119 from Korean Patent Application No. 10-2008-128772, filed on Dec. 17, 2008, the disclosure of which are hereby incorporated herein by reference in its entirety.

BACKGROUND

1. Field

Example embodiments relate to a semiconductor memory device, and more particularly, to a semiconductor memory device having dynamic memory cells without cell capacitors (hereinafter, referred to as "capacitorless dynamic memory cells") and a method for operating the semiconductor memory device.

2. Description of Related Art

A unit memory cell of a dynamic random access memory (DRAM) is traditionally composed of one transistor and one capacitor. However, considering that the cell capacitor may act as a limit to scaling down a topological size of the memory device, there has been proposed a memory cell without a cell capacitor, which is called a "capacitorless memory cell," simply having one transistor (1T) only. In such a 1T DRAM, a unit memory cell may include a body floated (i.e., electrically isolated) in the structure.

A general capacitorless memory may be fabricated on a silicon-on-insulator (SOI) wafer where silicon may be formed on an insulator, and senses data by accumulating majority carriers (holes or electrons) in a floating body or by releasing the majority carriers from the floating body. If majority carriers are accumulated in the floating body, it is represented as data "1." On the other hand, if majority carriers are released from the floating body, it is represented as data "0."

General capacitorless memory devices come in two types: one uses the characteristics of a metal-oxide-semiconductor (MOS); and the other uses the characteristics of a bipolar junction transistor (BJT). It is well known that the BJT is better than the MOS in high frequency operation and charge retention.

SUMMARY

Example embodiments provide a semiconductor memory device having capacitorless dynamic memory cells in a BJT operation.

Example embodiments may also provide a method for operating a semiconductor memory device having capacitorless dynamic memory cells.

Example embodiments may be directed to a semiconductor memory device including: a memory cell array having a plurality of memory cells coupled between a plurality of word lines, a plurality of source lines and a plurality of bit lines. Each memory cell includes a transistor having a floating body. The semiconductor memory device may further include a controller configured to read data from at least one of the memory cells while restoring data to the memory cell storing a first data state through a BJT operation of the memory cell. The controller may read data from at least one of the memory cells by applying a first source-line control voltage to a selected one of the source lines and applying a first word-line control voltage to a selected one of the word lines in a first period of a read operation. The controller may restore data to the memory cell, which is storing a second data state, by applying a second source-line control voltage to the selected source line and applying a second word-line control voltage to the selected word line in a second period of the read operation.

In another example embodiment, the controller may restore data to the memory cell, which is storing the first data state, by a bipolar current induced through the BJT operation during the first period and restore data to the memory cell, which is storing the second data state, by a coupling effect during the second period.

In another example embodiment, the second source-line control voltage may be lower than the first source-line control signal and the second word-line control voltage may be higher than the first word-line control signal.

In example embodiments, the controller may precharge at least one of the selected bit lines to a required or predetermined precharge voltage before the first period in the read operation, electrically float the selected bit line during the first period, and apply a data retention voltage to the unselected bit lines during the first and second periods.

In example embodiments, the controller may precharge all the bit lines to a required or predetermined precharge voltage before the first period in the read operation and may electrically float all the bit lines during the first period in the read operation.

In example embodiments, the controller may apply a first or second write voltage to at least one of the bit lines for storing the first or second data state in the memory cell, apply the first source-line control voltage to a selected one of the source lines, and apply a third word-line control voltage to a selected one of the word lines, in sequence during a write operation.

In example embodiments, the second word-line control voltage may be the same as the third word-line control voltage or the second word-line control voltage may be lower than the third word-line control voltage.

In example embodiments, during an operation of data retention, the controller may apply a data retention voltage to the bit line, apply the second source-line control voltage to the source line, and apply a fourth word-line control voltage to the word line.

In example embodiments, the first word-line control voltage may be the same as the fourth word-line control voltage, or higher than the fourth word-line control voltage but lower than the third word-line control voltage.

In example embodiments, the controller may apply the first word-line control voltage, the fourth word-line control voltage and the second word-line control voltage in sequence to the word line during the second period.

In example embodiments, the data retention voltage applied to the bit line may be the same as the second source-line control voltage, the second write voltage may be lower than the data retention voltage, and the first write voltage may be lower than the second write voltage.

Other example embodiments may be directed to a method for operating a semiconductor memory device including a memory cell array having a plurality of memory cells coupled between a plurality of word lines, a plurality of source lines and a plurality of bit lines. Each memory cell includes a transistor having a floating body. The method may include: reading data from at least one of the memory cells while restoring data to the memory cell storing a first data state through a BJT operation of the memory cell by applying a first source-line control voltage to a selected one of the source lines and applying a first word-line control voltage to at least one of the selected word lines in a first period of a read operation. The method may further include restoring data to the memory cell, which is storing a second data state, by applying a second source-line control voltage, which is lower than the first source-line control voltage, to the selected source line and applying a second word-line control voltage to the selected word line in a second period of the read operation.

In example embodiments, data may be restored to the memory cell storing the first data state by a bipolar current induced through the BJT operation in reading data from at least one of the memory cells. Additionally, data may be restored to the memory cell storing the second data state by a coupling effect in restoring data to the memory cell.

In example embodiments, the method may further include precharging at least one selected from the bit lines to a required or predetermined precharge voltage before the first period in the read operation. Here, the selected bit lines may be electrically floated during the first period and a data retention voltage may be applied to the unselected bit lines during the first and second periods.

In example embodiments, the method may further include writing data to the memory cell by applying a first or second write voltage to at least one of the bit lines for storing the first or second data state in the memory cell, applying the first source-line control voltage to the selected source line, and applying a third word-line control voltage to the selected word line in a write operation.

In example embodiments, writing data to the memory cell may include: applying the first or second write voltage to the bit line and applying the first source-line control voltage to the selected source line. The method may further include applying the third word-line control voltage to the selected word line and applying a fourth word-line control voltage, which is lower than the third word-line control voltage, to the selected word line. The method may also include applying the second source-line control voltage, which is lower than the first source-line control voltage, to the selected source line; and applying a data retention voltage to the bit lines.

In example embodiments, the second word-line control voltage may be equal to or lower than the third word-line control voltage.

In example embodiments, the method may further include retaining data of the memory cells by applying the data retention voltage to the bit lines in an operation of data retention, applying the second source-line control voltage to the source lines and applying the fourth word-line control voltage to the word lines.

In example embodiments, the first word-line control voltage may be the same as the fourth word-line control voltage.

In example embodiments, the first word-line control voltage may be higher than the fourth word-line control voltage and lower than the third word-line control voltage. The method may further include restoring data to the memory cell storing the second data state may include: applying the second source-line control voltage to the selected source line and applying the fourth word-line control voltage to the selected word line; applying the second word-line control voltage to the selected word line; and applying the fourth word-line control voltage to the selected word line.

In example embodiments, the data retention voltage may be the same as the second source-line control voltage, the second write voltage may be lower than the data retention voltage, and the first write voltage may be lower than the second write voltage.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF EXAMPLE EMBODIMENTS

Various example embodiments will now be described more fully with reference to the accompanying drawings in which some example embodiments are shown.

Detailed illustrative embodiments are disclosed herein. However, specific structural and functional details disclosed herein are merely representative for purposes of describing example embodiments. Example embodiments, however, may be embodied in many alternate forms and should not be construed as limited to only the example embodiments set forth herein.

It should be understood, however, that there is no intent to limit the example embodiments to the particular example embodiments disclosed, but on the contrary example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Figure 1:
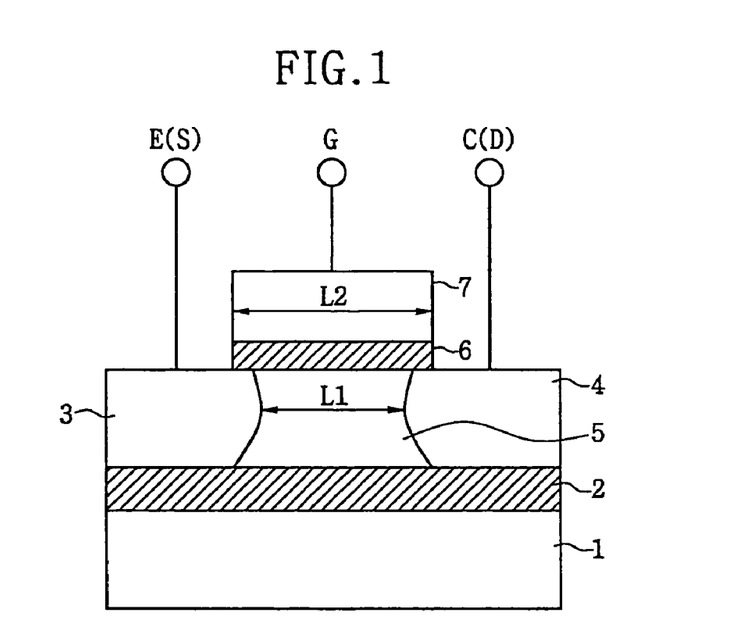
FIG. 1 is a cross-sectional view of a capacitorless dynamic memory cell.

FIG. 1 exemplarily illustrates a vertical cross-section of a capacitorless dynamic memory cell. Referring to FIG. 1, the capacitorless dynamic memory cell includes a substrate 1, an insulating layer 2 formed on the substrate 1, first and second nodes 3 and 4 formed separately from each other on the insulating layer 2, a floating body region 5 disposed between the first and second nodes 3 and 4, a gate insulating layer (gate oxide layer or gate dielectric layer) 6 formed on the floating body region 5, and a gate 7 formed on the gate insulating layer 6.

The substrate 1 may have P- or N-type conductivity. If the dynamic memory cell shown in FIG. 1 is made of an NMOS transistor, the substrate 1 is a P-type substrate. The insulating layer 2 may be an insulator included in an SOI structure.

In a MOS operation, the first and second nodes 3 and 4 may function as a source S and a drain D, respectively. In a BJT operation, the first and second nodes 3 and 4 may function as an emitter E and a collector C, respectively. The first and second nodes 3 and 4 may be changed with each other. As an example embodiment, the first and second nodes 3 and 4 may have N- or P-type conductivity. If the dynamic memory cell is an NMOS transistor, the first and second nodes 3 and 4 may have N-type conductivity.

The conductivity of the floating body region 5 may be different from those of the first and second nodes 3 and 4. If the dynamic memory cell is made of an NMOS transistor, the floating body 4 may have P-type conductivity. Thus, the BJT shown in FIG. 1 may be referred to an NPN BJT. The floating body region 5 may be laid to be electrically isolated from the substrate 1 through the insulating layer 2. As illustrated in FIG. 1, the floating body region 5 may be designed to have a floating body length L1.

The dynamic memory cell may include a gate structure composed of the gate insulating layer 6 and the gate 7. The gate 7 may be designed to have a gate length L2. As shown in FIG. 1, the capacitorless dynamic memory cell having the floating body region 5 may be formed or fabricated on the insulating layer 2 that may be additionally provided on the silicon substrate 1. As mentioned above, the emitter(source) E(S) and the collector(drain) C(D) may be changed with each other because they are relative to each other.

L1 denotes an interval between the emitter(source) E(S) and the collector(drain) C(D). L2 denotes the gate length. In an example embodiment, L2 is longer than L1. This is because the technology of self-alignment or lightly doped drain (LDD) is used to form an emitter (source) and a collector (drain) and heat treatment is carried out for stabilization.

Figure 2:
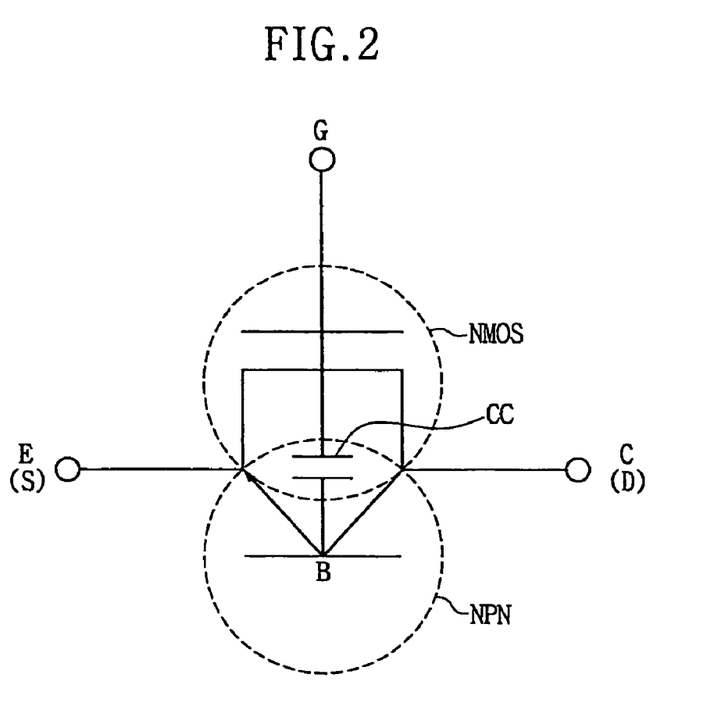
FIG. 2 is an equivalent circuit diagram of the capacitorless dynamic memory cell shown in FIG. 1.

FIG. 2 shows an equivalent circuit of the capacitorless dynamic memory cell shown in FIG. 1. Referring to FIG. 2, the equivalent circuit may include one NMOS transistor and one NPN BJT. For instance, the emitter (source) E (S), the collector (drain) C (D) and the gate G constitute the NMOS transistor. As also, the emitter E (S), the collector C (D) and the floating body region 5 (this can act as a base B) constitute the NPN BJT. As illustrated in FIG. 2, a coupling capacitor CC is formed between the gate G of the NMOS transistor and the base B of the NPN BJT.

In an example embodiment, the read operation and/or the write operation may be performed through a BJT operation of the memory cell. In other words, the NPN BJT is used to read from and write to the dynamic memory cell. The NPN BJT may generate a bipolar transistor current for writing data to the dynamic memory cell or reading data from the dynamic memory cell.

Although not shown, in a semiconductor memory device having the capacitorless dynamic memory cells (this can be called a "capacitorless semiconductor memory device"), the emitter (source) E (S) may be connected to a source line, the collector (drain) C (D) may be connected to a bit line, and the gate G is connected to a word line.

An operation of writing data to the capacitorless dynamic memory cell will be described hereinafter.

First, in writing data "1" to the capacitorless dynamic memory cell, a first write voltage (e.g., 0 V) may be applied to a selected bit line, a first control voltage (e.g., 2.6 V) may be applied to a corresponding source line, and a required or alternatively predetermined rising pulse may be applied to a selected word line. If the rising pulse is applied to the selected word line, a coupling capacitor CC may induce a capacitive coupling effect to increase a potential of the floating body region 5 or the base B. Then, a forward bias may be applied between the emitter (source) E (S) and the base B and a reverse bias may be applied between the base B and the collector (drain) C (D). Under the bias conditions, the NPN BJT may be turned on. As a result, electrons may move as far as the junction between the base B and the collector (drain) C (D) from the emitter (source) E (S) through the floating body region 5, regardless of data stored in the dynamic memory cell. These electrons collide with a silicon interface at the junction and may generate electron-hole pairs (EHPs). This phenomenon may be called "impact ionization." In other words, the rising pulse applied to the gate through the selected word line turns the NPN BJT on and, regardless of data stored in the dynamic memory cell, the impact ionization may be actively induced between the base B and the collector C (the drain D) to generate EHPs.

With regard to the EHPs, electrons may move to the collector (drain) C (D) from the junction and holes move to the base B from the junction. Such an operation may be repeated and multiplied by positive feedback. This may be called "avalanche breakdown." As a result of the positive feedback, holes are accumulated in the floating body region 5. This state may be referred to as data "1" written to the capacitorless dynamic memory cell.

In writing data "0" to the capacitorless dynamic memory cell, a second write voltage (e.g., 0.5 V) higher than the first write voltage may be applied to a selected bit line, the first control voltage (e.g., 2.6 V) may be applied to a corresponding source line, and a required or alternatively a predetermined rising pulse may be applied to a selected word line. Since the second write voltage (i.e., 0.5 V) may be applied to the selected bit line, the NPN BJT may not turned on even while the rising pulse may be applied to the selected word line. Thus, there may be no induction of the avalanche breakdown in the NPN BJT and holes of the floating body region 5 may be discharged into the bit line by the coupling effects of the coupling capacitor CC. This state may be referred to as data "0" written to the capacitorless dynamic memory cell.

Read and restore operations of the capacitorless semiconductor memory device will be described later.

Figure 3:
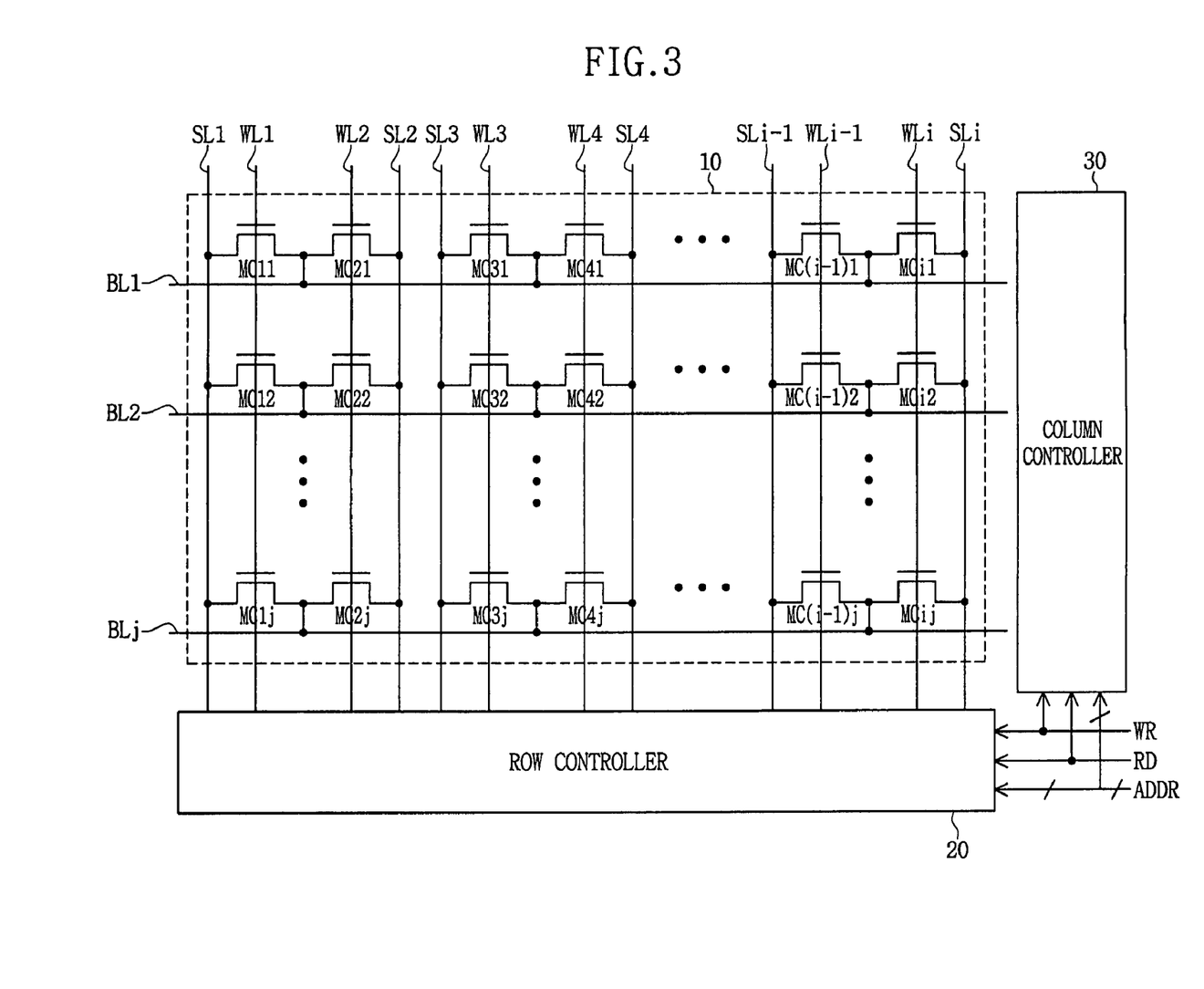
FIG. 3 is a circuit diagram illustrating an example embodiment of a semiconductor memory device having capacitorless dynamic memory cells.

FIG. 3 illustrates an example embodiment of the semiconductor memory device, which may include a memory cell array 10, a row controller 20 and a column controller 30.

The blocks shown in FIG. 3 function as follows.

The memory cell array 10 includes a plurality of capacitorless dynamic memory cells MC11 to MCij. The memory cells MC11 to MCij are each connected to a plurality of word lines WL1 to WLi, a plurality of source lines SL1 to SLi and a plurality of bit lines BL1 to BLj. The source lines SL1 to SLi may be connected to a corresponding emitter (source) of a capacitorless dynamic memory cell, the bite lines BL1 to BLj may be connected to a corresponding collector (drain) of the capacitorless dynamic memory cell and the word lines WL1 to WLi may be connected to a corresponding gate of the capacitorless dynamic memory cell. The memory cells of the memory cell array 10 operate to write or read data in response to signals transferred through the word lines, the source lines and the bit lines.

The row and column controllers 20 and 30 receive a write command WR, a read command RD and address signals ADDR to control the word lines WL1 to WLi, the source lines SL1 to SLi and the bit lines BL1 to BLj. In detail, the row controller 20 applies a required or predetermined voltages to the word lines WL1 to WLi and the source lines SL1 to SLi in response to the write command WR, the read command RD and the address signals ADDR. The column controller 30, responding to the write command WR, the read command RD and the address signals ADDR, applies required or predetermined voltages to the bit lines BL1 to BLj, precharges a corresponding one of the bit lines BL1 to BLj, and senses and amplifies data transferred through the corresponding bit line.

As illustrated in FIG. 3, the word lines WL1 to WLi and the source lines SL1 to SLi may be arranged in the same direction and the bit lines BL1 to BLj may be arranged to intersect the word lines WL1 to WLi and the source lines SL1 to SLi.

Also as shown in FIG. 3, the row controller 20 may receive the address signal ADDR for selecting one of the word lines WL1 to WLi and one of the source lines SL1 to SLi in response to the write command WR or the read command RD. The column controller 30 may receive the address signal ADDR for selecting one of the bit lines BL1 to BLj in response to the write command WR or the read command RD.

Additionally, the column controller 30 may provide data information to a selected bit line during a write operation and receive data information from a selected bit line during a read operation.

While FIG. 3 illustrates the row controller 20 and the column controller 30 separated from each other, it is possible to implement the two controllers in a single controller that performs row and column control functions.

Figure 4:
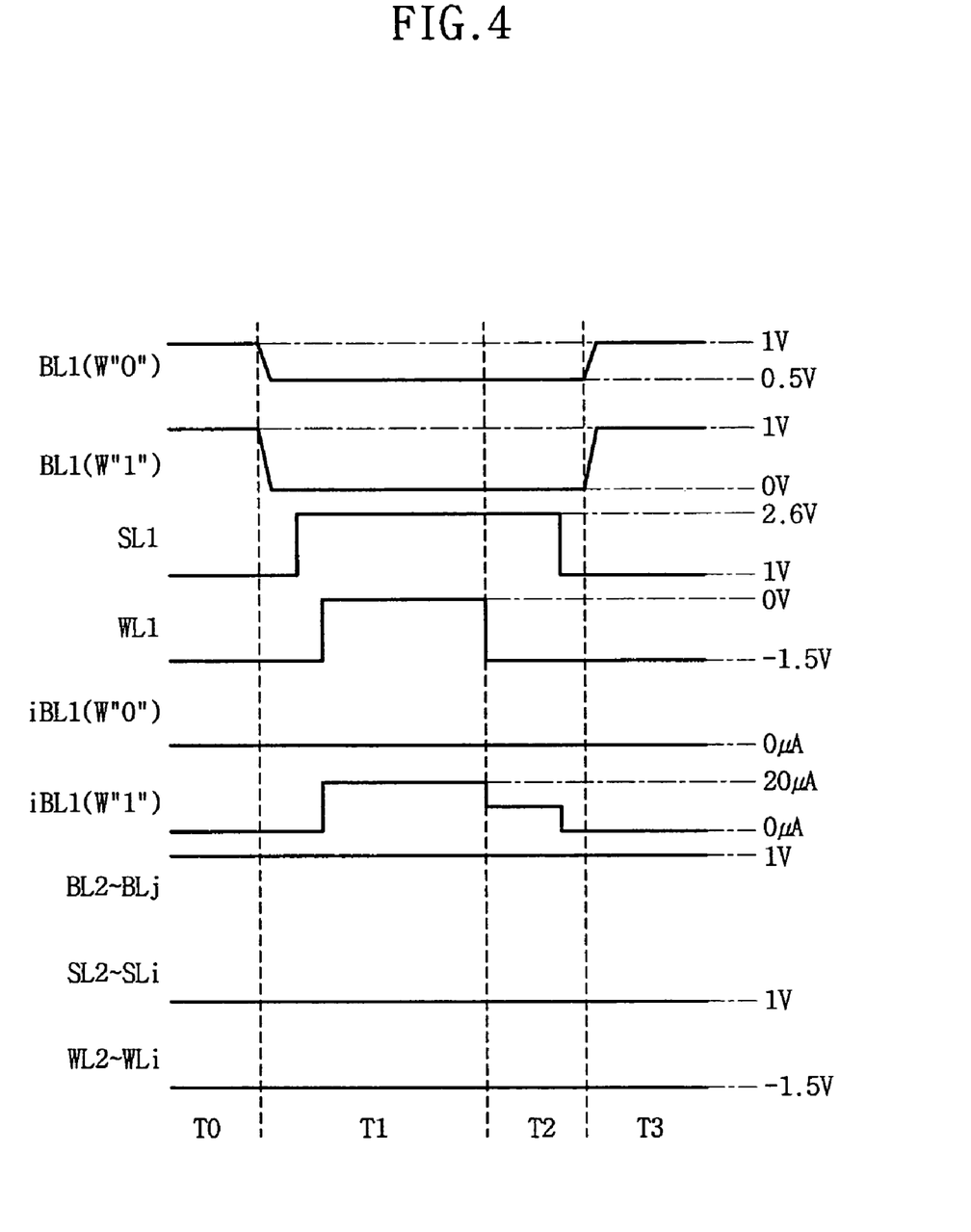
FIG. 4 is a timing diagram illustrating a write operation of the semiconductor memory device shown in FIG. 3.

FIG. 4 is a timing diagram illustrating a write operation in the semiconductor memory device shown in FIG. 3. FIG. 4 exemplarily shows a case of writing data to a memory cell (e.g., MC11) connected to the word line WL1, the source line SL1 and the bit line BL1. That is, the timing process of FIG. 4 may be operating when the row controller 20 selects the word line WL1, as one of the word lines WL1 to WLi, and the source line SL1, as one of the source line SL1 to SLi, in response to the address signal ADDR, and when the column controller 30 selects the bit line BL1 as one of the bit lines BL1 to BLj. In FIG. 4, BL1(W"0") denotes a voltage of the bit line BL1 connected to the memory cell MC11 when data "0" is written to the memory cell MC11. BL1(W"1") denotes a voltage of the bit line BL1 connected to the memory cell MC11 when data "1" is written to the memory cell MC11. FIG. 4 also shows voltages of the source and word lines SL1 and WL1 connected to the selected memory cell MC11 in the write operation. iBL1(W"0") denotes a bipolar current flowing through the memory cell MC11 and the bit line BL1 connected to the memory cell MC11 when data "0" is written to the memory cell MC11. iBL1(W"1") denotes a bipolar current flowing through the memory cell MC11 and the bit line BL1 connected to the memory cell MC11 when data "1" is written to the memory cell MC11. Further, in the timing diagram of FIG. 4, voltages of the bit lines BL2 to BLj, the source lines SL2 to SLi and the word lines WL2 to WLi which are disconnected from the selected memory cell MC11 in the write operation are also shown.

Hereinafter, the write operation of the semiconductor memory device having the capacitorless dynamic memory cells (i.e., the capacitorless semiconductor memory device) will be described with reference to FIGS. 1 through 4.

In period T0, for the purpose of retaining data, the row controller 20 applies a fourth word-line control voltage (e.g., −1.5 V) to the word lines WL1 to WLi and applies a second source-line control voltage (e.g., 1 V) to the source lines SL1 to SLi. And, the column controller 30 applies a data retention voltage (e.g., 1 V) to the bit lines BL1 to BLj. The second source-line control voltage may be the same as the data retention voltage, e.g., 1 V, in voltage level.

In period T1, the row controller 20 operates to continuously apply: a first source-line control voltage (e.g., 2.6 V), which is higher than the second source-line control voltage, to the selected source line SL1. The row controller 20 also continuously applies a third word-line control voltage (e.g., 0 V), which is higher than the fourth word-line control voltage, to the selected word line WL1. Additionally, row controller 20 continuously applies the first source-line control voltage (e.g., 1 V) to the unselected source lines SL2 to SLi; and the first word-line control voltage (e.g., −1.5 V) to the unselected word lines WL2 to WLi. That is, the selected word line WL1 is activated with a rising pulse having a second amplitude. Here, the second amplitude may correspond to a difference between the third word-line control voltage (e.g., 0 V) and the fourth word-line control voltage (e.g., −1.5 V).

If data "1" is to be written to the memory cell MC11, the column controller 30 applies the first write voltage (e.g., 0 V) to the selected bit line BL1. If data "0" is to be written to the memory cell MC11, the column controller 30 applies the second write voltage (e.g., 0.5 V) to the selected bit line BL1 while applying the data retention voltage (e.g., 1 V) to the unselected bit lines BL2 to BLj.

In writing data "1" to the memory cell MC11, the first write voltage (e.g., 0 V) may be applied to the bit line BL1, the first source-line control voltage (e.g., 2.6 V) is applied to the source line SL1, and the third word-line control voltage (0V) is applied to the word line WL1. That is, a rising pulse is applied to the selected word line WL1. In this example embodiment, as stated above, the rising pulse turns the NPN BJT on regardless of data stored in the memory cell MC11. Thereby, the impact ionization actively rises between the base B and the collector (drain) C (D) and holes are crowded into the floating body region 5 of the memory cell MC11. Then, data "1" is written to the memory cell MC11.

In writing data "0" to the memory cell MC11, the second write voltage (e.g., 0.5 V) may be applied to the bit line BL1, the second source-line control voltage (e.g., 2.6 V) is applied to the source line SL1, and the third word-line control voltage (0 V) is applied to the word line WL1. That is, a rising pulse is applied to the selected word line WL1. In this example embodiment, as mentioned above, the NPN BJT may not turn on due to the second write voltage and holes are released from the floating body region 5 to the bit line BL1 by a coupling effect of the capacitor CC between the gate G and the base B. Thus, data "0" is written to the memory cell MC11.

As shown in FIG. 4, during period T2, a first bipolar current i1 flowing through the bit lines BL1 to BLj is smaller than a second bipolar current i2. This is because a potential of the floating body region 5 may be reduced as a result of the coupling effect by the capacitor CC.

In period T3, the row and column controllers 20 and 30 perform an operation of data retention, as in period T0, by applying: the first word-line control voltage (e.g., −1.5 V) to the word lines WL1 to WLi; the second source-line control voltage (e.g., 1 V) to the source lines SL1 to SLi; and the data retention voltage (e.g., 1 V) to the bit lines BL1 to BLj.

The row and column controllers 20 and 30 as shown in FIG. 4, may be configured to sequentially apply the control voltages to the word lines WL1 to WLi, the source lines SL1 to SLi and the bit lines BL1 to BLj so as to reduce the probability or prevent a malfunction of the semiconductor memory device. For instance, the row and column controllers 20 and 30 apply the control voltages to the selected bit line BL1, the selected source line SL1 and the selected word line WL1 in this order, as noted in period T1 of FIG. 4. Additionally, as noted in period T1 of FIG. 4, the row and column controllers 20 and 30 apply the control voltages to the selected word line WL1, the selected source line SL1 and the selected bit line BL1 in this order.

While FIG. 4 exemplifies the case that data is written to the memory cell MC11 as one of the memory cells MC11 to MC1j, it may also be possible to write data to two or more memory cells placed in the same row, i.e., two or more memory cells connected to the same word and source lines, or to coincidentally write data to all memory cells placed in the same row. In this example embodiment, the column controller 30 may be configured to apply the first or second write voltage to selected bit lines of BL1 to BLj or all of the bit lines BL1 to BLj so as to write data "0" or "1" to memory cells connected to the selected bit lines or the entire bit lines BL1 to BLj.

Next, the read operation of the capacitorless semiconductor memory device will be described as follows.

Figure 5:
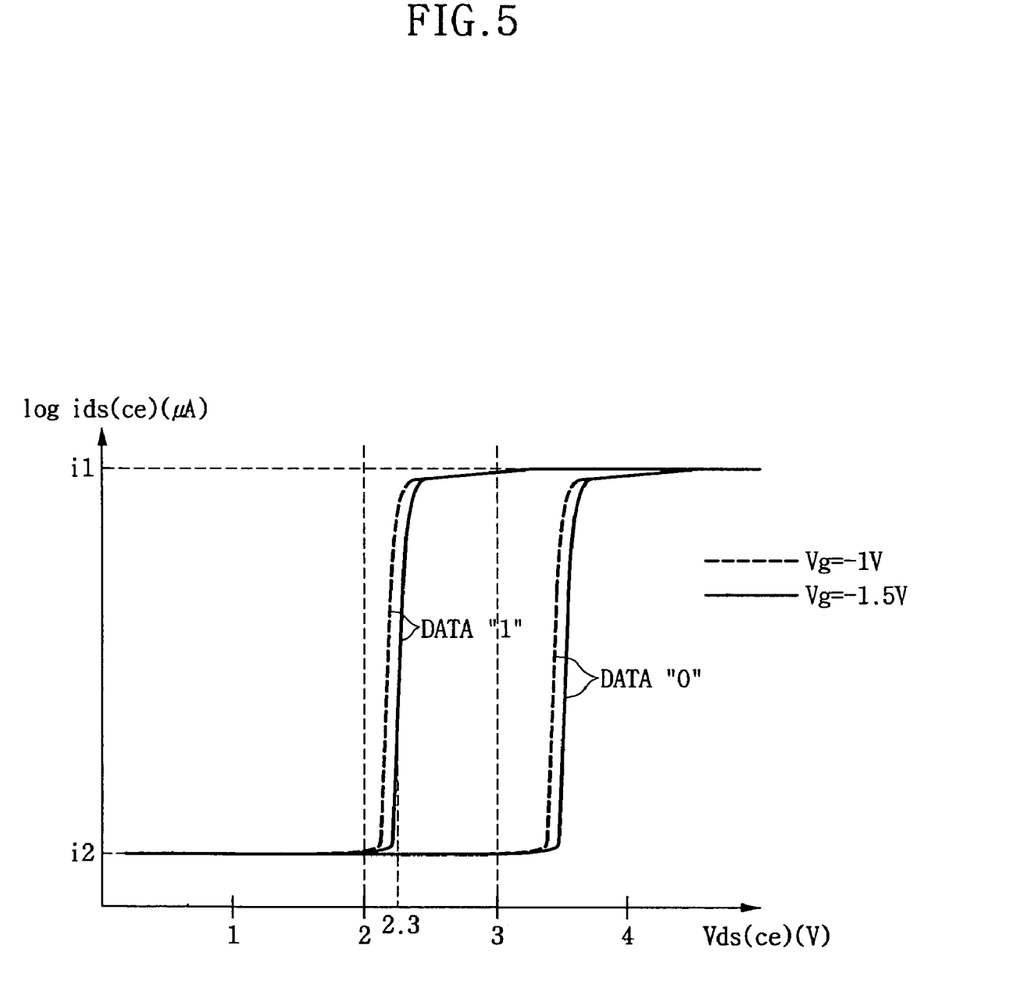
FIG. 5 is a graphic diagram showing the DC characteristics in a read operation in the capacitorless dynamic memory cell.

FIG. 5 shows a graph of the DC characteristics (i.e., IV characteristics) in the read operation in the capacitorless dynamic memory cell. The graph of FIG. 5 depicts variations of a current Ids (or Ice), which flows from the collector (drain) C(D) to the emitter (source) E(S), to a voltage Vds (or Vce) between the collector(drain) C(D) and the emitter(source) E(S) (hereinafter referred to as "drain-source voltage Vds" or "collector-emitter voltage Vce") on the condition that data stored in the memory cell is "1" and "0" when a gate voltage Vg may be set to −1.5 V and −1 V, respectively. In FIG. 5, the solid lines represent the IV characteristics when the gate voltage Vg applied to the gate G of the memory cell through a selected word line may be the fourth word-line control voltage (e.g., −1.5 V) that may be supplied to the selected word line during the operation of data retention. The dashed lines of FIG. 5 represent the IV characteristics when the gate voltage Vg is higher than the fourth word-line control voltage (e.g., −1.5 V) but lower than the third word-line control voltage (e.g., 0 V) that is applied during the write operation.

As can be seen from FIG. 5, the drain-source current Ids (or the collector-emitter current Ice) abruptly increases if the drain-source voltage Vds (or the collector-emitter voltage Vce) is over a required or predetermined level. In detail, if the drain-source voltage Vds (the collector-emitter voltage Vce) becomes higher than the required or predetermined level, a drain coupling effect induces holes to flow into the base B. Then, a potential of the base B may rise to form a forward bias between the base B and the emitter (source) E (S), which causes the impact ionization as mentioned above. The impact ionization forces holes to be crowded into the base B and hence the avalanche breakdown stated above causes an abrupt increase of the bipolar current (i.e., Ids or Ice). Then, the first bipolar current i1 flows through the memory cell.

On the other hand, if the drain-source voltage Vds (i.e., the collector-emitter voltage Vce) is lower than the required or predetermined level, the NPN BJT may maintain its off state. Accordingly, the second bipolar current i2 may be smaller than the first bipolar current i1 flows through the memory cell. The second bipolar current i2 may be almost zero.

As shown in FIG. 5, the bipolar current Ids (Ice) may increase since the NPN BJT is turned on at the collector-emitter voltage Vce (the drain-source voltage Vds) that may be lower when data "1" is stored in the memory cell than when data "0" is stored in the memory cell. This phenomenon arises from the fact that the NPN BJT may be enabled earlier in the case of storing data "1" than in the case of storing data "0", because a forward bias may be first formed between the emitter E and the base B since the floating body region 5 itself is conditioned in a high potential by holes in the floating body region 5.

As also shown in FIG. 5, if the gate voltage Vg rises, the NPN BJT is turned on at the lower collector-emitter voltage Vce (the drain-source voltage Vds) and thereby the bipolar current Ice (Ids) begins to increase. This is because the NPN BJT may be turned on in response to the lower collector-emitter voltage Vce (the drain-source voltage Vds) since the floating body region 5, i.e., the base B, may become higher in static potential if the gate voltage Vg rises.

Figure 6:
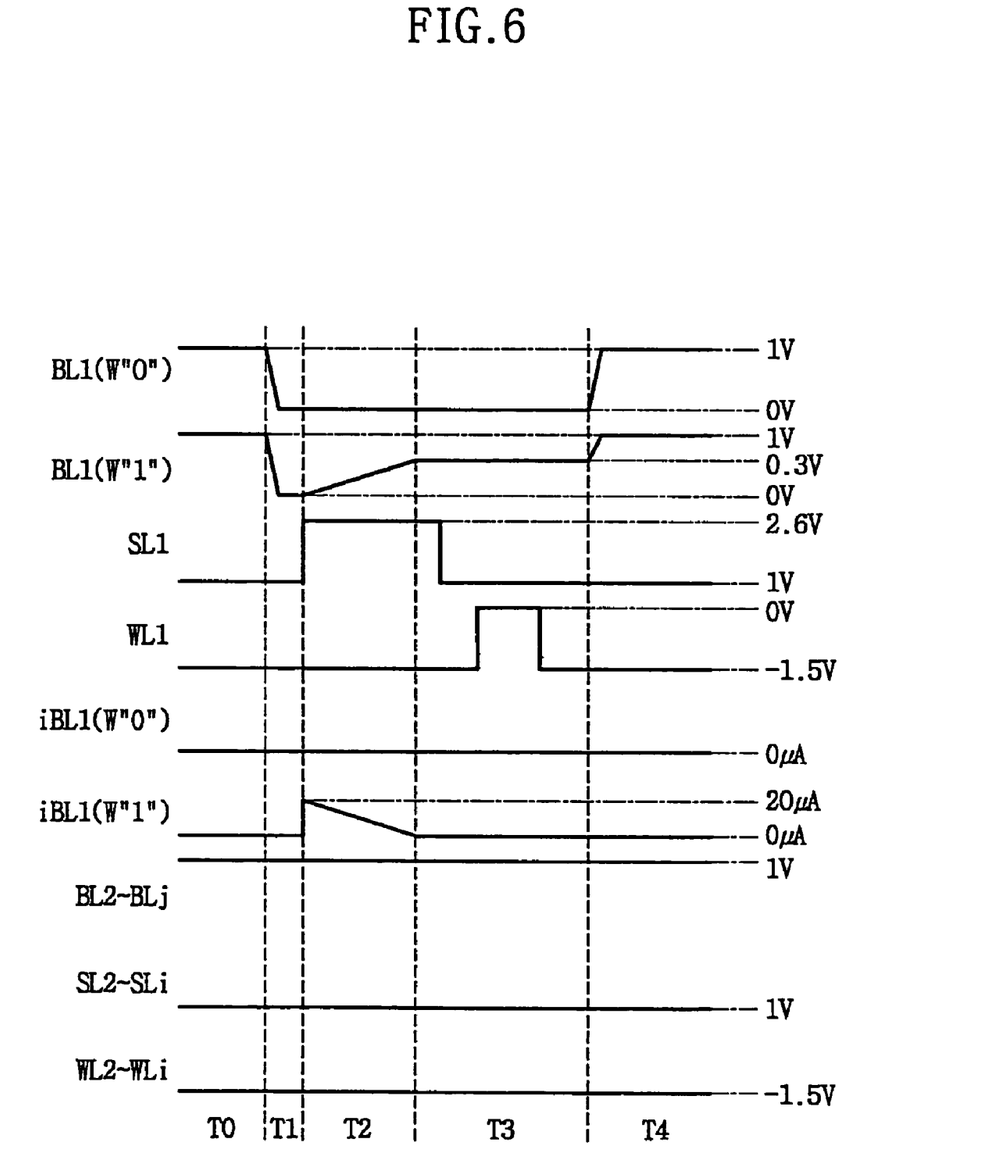
FIG. 6 is a timing diagram illustrating an example embodiment of the read operation of the semiconductor memory device shown in FIG. 3.

FIG. 6 is a timing diagram illustrating an example embodiment of the read operation of the semiconductor memory device shown in FIG. 3, and exemplifies a case of reading data from the memory cell MC11 as one of the memory cells MC11 to MC1j. SL1, WL1, BL2 to BLj, SL2 to SL1 and WL2 to WLi in FIG. 6 are the same as those described in FIG. 4. In FIG. 6, BL1(W"0") denotes a voltage of the selected bit line BL1 when data "0" is stored in the memory cell MC11, while BL1(W"1") denotes a voltage of the selected bit line BL1 when data "1" is stored in the memory cell MC11. iBL1 (W"0") denotes a bipolar current flowing through the memory cell MC11 and the bit line BL1 when data "0" is stored in the memory cell MC11, while iBL1(W"1") denotes a bipolar current flowing through the memory cell MC11 and the bit line BL1 when data "1" is stored in the memory cell MC11.

Now, with reference to FIGS. 1 through 3, FIG. 5 and FIG. 6, the read operation of the capacitorless semiconductor memory device according to an example embodiment will be described.

In period T0, the row and column controllers 20 and 30 may perform an operation of data retention by applying: the fourth word-line control voltage (e.g., −1.5 V) to the word lines WL1 to WLi; the second source-line control voltage (e.g., 1 V) to the source lines SL1 to SLi; and the data retention voltage (e.g., 1 V) to the bit lines BL1 to BLj.

In period T1, the column controller 30 may precharge the bit line BL1, which is connected to the memory cell MC11, i.e., the selected bit line BL1, to a precharge voltage (e.g., 0 V) in response to the read command RD and the address signal ADDR. Meanwhile, the column controller 30 may continuously applies the data retention voltage (e.g., 1 V) to the other bit lines BL2 to BLj disconnected from the memory cell MC11, i.e., the unselected bit lines BL2 to BLj. During this, the row controller 20 may continuously applies the fourth word-line control voltage (e.g., −1.5 V) to the word lines WL1 to WLi and the second source-line control voltage (e.g., 1 V)

to the source lines SL1 to SLi. After precharging, the selected bit line BL1 may be electrically floated. Afterward, a voltage of the bit line BL1 may be variable in accordance with data stored in the memory cell MC11.

In period T2, the row controller 20 may apply the first source-line control voltage (e.g., 2.6 V) to the source line SL1, which may be connected with the memory cell MC11, i.e., the selected source line SL1, in response to the read command RD and the address signal ADDR. Thus, the collector-emitter voltage Vce (or the drain-source voltage Vdc) of the memory cell MC11 becomes 2.6 V. The row controller 20 may be configured to apply the first word-line control voltage to the word line WL1, which is connected with the memory cell MC11, i.e., the selected word line, in response to the read command RD and the address signal ADDR. In this case, as shown in FIG. 6, the first word-line control voltage may be the same as the fourth word-line control voltage (e.g., −1.5V) that is applied to the word lines during the operation of data retention.

As can be seen from FIG. 5, if the collector-emitter voltage Vce (the drain-source voltage Vds) is 2.6 V and the memory cell MC11 is storing data "1", the NPN BJT may be turned on to abruptly increase the bipolar current. Then, the voltage of the bit line BL1 gradually increases until the voltage Vce (Vds) reaches 2.3 V. In other words, the voltage of the bit line BL1 becomes about 0.3 V in period T2 if the memory cell MC11 is storing data "1."

On the other hand, if the memory cell MC11 is storing data "0," the NPN BJT may be turned off to interrupt the bipolar current (i.e., Ids or Ice). Thus, the voltage of the bit line BL1 maintains the precharge voltage (e.g., 0V).

For instance, in period T2, if the collector-emitter voltage Vce (the drain-source voltage Vds) reaches the first source-line control voltage (e.g., 2.6V), the BJT operation may be enabled in a memory cell storing data "1," but disabled in a memory cell storing data "0." The first bipolar current i1 induced by the BJT operation flows through the memory cell MC11 if data "1" is stored in the memory cell MC11. But, if data "0" is stored in the memory cell MC11, the second bipolar current i2 almost close to zero flows through the memory cell MC11. In other words, the bipolar current barely flows through the memory cell MC11 when data "0" is stored in the memory cell MC11.

In period T2, data restoration is coincident with the read operation to the memory cell storing data "1." As stated above, if the memory cell MC11 is storing data "1," the NPN BJT is turned on to abruptly increase the bipolar current. In the process of the BJT operation, holes are accumulated in the floating body region 5 and then data "1" is restored to the memory cell MC11. This sequence will be easily understood with reference to the description about the write operation described in FIGS. 2 through 4.

In period T3, the row controller 20 applies the second source-line control voltage (e.g., 1 V) to the selected source line SL1 and the second word-line control voltage to the selected word line WL1. As shown in FIG. 6, the second word-line control voltage may be the same as the third word-line control voltage (e.g., 0 V) in level, which is applied in the write operation. That is, the row controller 20 applies a rising pulse, which has the first amplitude, to the selected word line WL1. The first amplitude may correspond to a difference between the fourth word-line control voltage (e.g., −1.5 V) and the second word-line control voltage (e.g., 0 V). Thus, the first amplitude of the rising pulse applied to the selected word line WL1 in the read operation may be the same as the second amplitude of the rising pulse applied to the selected word line WL1 in the write operation.

If the selected memory cell MC11 is storing data "0", the voltage of the bit line BL1 maintains the precharge voltage (e.g., 0V) in period T2 as mentioned above. When the second word-line control voltage (i.e., the rising pulse) is applied to the gate G of the memory cell MC11 through the word line WL1, a gate coupling effect causes a potential of the base B to be lowered. Then, holes of the floating body region 5 are released into the bit line BL1 through the collector (drain) C (D).

If the selected memory cell MC11 is storing data "1", the voltage of the bit line BL1 is the required or predetermined voltage (e.g., 0.3 V) in period T2 as mentioned above. That is, a potential of the collector (drain) C (D) is lower when the memory cell MC11 is storing data "0" than when the memory cell MC11 is storing data "1." In detail, if the memory cell MC11 is storing data "1", a potential barrier is formed between the floating body region 5 and the collector (drain) C (D). And, since the second source-line control voltage (e.g., 1 V) lower than the first source-line control voltage (e.g., 2.6 V) used in the write operation is also applied to the source line SL1, holes are not released from the floating body region 5 although the second word-line control voltage (i.e., the rising pulse) may be applied to the gate G of the memory cell MC11.

In period T3 of FIG. 6, the row controller 20 applies the second source-line control voltage (e.g., 1 V) to the source line SL1 and the second word-line control voltage (i.e., the rising pulse) to the word line WL1, so that data restoration is performed in the memory cell MC11 storing data "0."

Afterward, in period T4, the row and column controllers 20 and 30 may enable the operation of data retention, as in period T0, by applying: the fourth word-line control voltage (e.g., −1.5 V) to the word lines WL1 to WLi; the second source-line control voltage (e.g., 1 V) to the source lines SL1 to SLi; and the data retention voltage (e.g., 1 V) to the bit lines BL1 to BLj.

While FIG. 6 exemplifies the case of reading data from the memory cell MC11 as a selected one of the memory cells MC11 to MC1j and restoring data to the memory cell MC11, it is also possible for the capacitorless semiconductor memory device to be in the configuration of reading/restoring data from/to two or more memory cells of the memory cells coupled to the same row, i.e., the same word and source lines.

Figure 7:
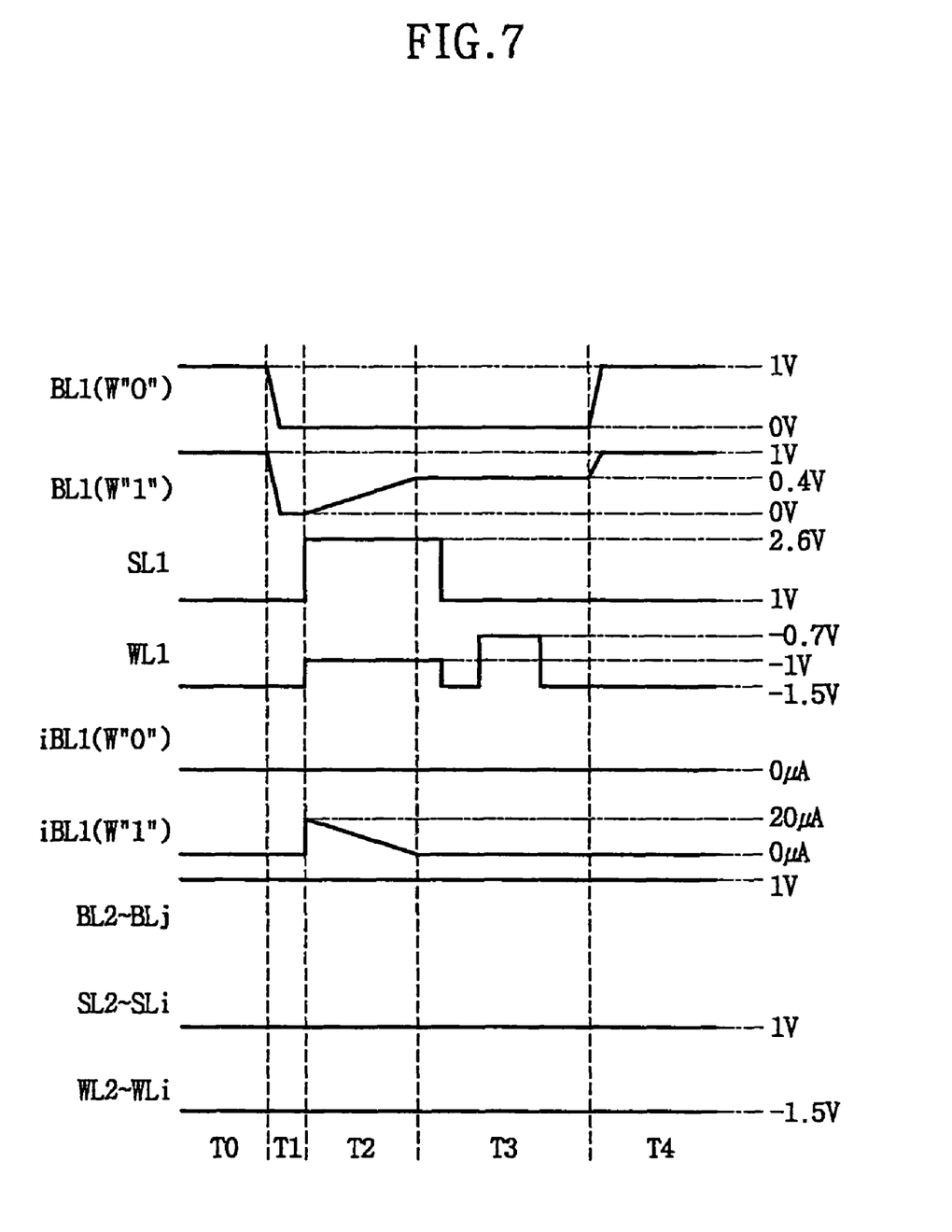
FIG. 7 is a timing diagram illustrating another example embodiment of the read operation of the semiconductor memory device shown in FIG. 3.

FIG. 7 is a timing diagram illustrating another example embodiment of the read operation of the semiconductor memory device shown in FIG. 3. SL1, WL1, BL2 to BLj, SL2 to SL1 and WL2 to WLi in FIG. 7 are the same as those described in FIG. 4. BL1(W"0"), BL1(W"1"), iBL1(W"0") and iBL1(W"1") denote the same as those of FIG. 6.

With reference to FIGS. 1 through 3, FIG. 5 and FIG. 7, another read operation of the capacitorless semiconductor memory device will be now described.

Operating sequences of periods T0, T1 and T4 in FIG. 7 are the same as explained with reference to FIG. 6.

An operation of period T2 may also be similar to that explained with reference to FIG. 6, except that the first word-line control voltage applied to the selected word line WL1 may be higher than the fourth word-line control voltage (e.g., −1.5 V) but lower than the third word-line control voltage (e.g., 0 V) in order to increase a sensing margin. That is, for the purpose of increasing a sensing margin, the first word-line control voltage applied to the selected word line WL1 may be slightly elevated during period T2.

As noted in FIG. 5, an increase of the gate voltage Vg may cause the collector-emitter voltage Vce (the drain-source voltage Vds), which turns the NPN BIT on, to be lowered. Therefore, if the memory cell MC11 is storing data "1", the voltage of the bit line BL1 may become higher in period T2 than the case of applying the first word-line control voltage, which has the same level with the fourth word-line control voltage (e.g., −1.5 V), to the word line WL1. As a result, the sensing margin for reading data from the memory cell MC11 may be increased. For this function, the row controller 20 may be configured to sequentially apply the first word-line control voltage (e.g., −1 V), the fourth word-line control voltage (e.g., −1.5 V) and the second word-line control voltage (e.g., 0 V) to the selected word line WL1 in period T3.

An operation in period T3 of FIG. 7 may also be the same as shown in FIG. 6, except that the row controller 20 may provide the selected word line WL1 with the second word-line control voltage (e.g., −0.7 V), which may be lower than the third word-line control voltage (e.g., −1.5 V) that is used in the write operation. In other words, a rising pulse of the second word-line control voltage may become smaller in amplitude. Since the row controller 20 makes the rising pulse applied to the word line when restoring data "0" smaller in amplitude, fewer holes may be released from the floating body region 5 so as to reduce or prevent data from being damaged when data "1" is stored in the selected memory cell MC11. Summarily, the amplitude of the rising pulse applied to the word line for restoring data "0" in the read operation may be smaller than that of the rising pulse applied to the word line in the write operation.

Figure 8:
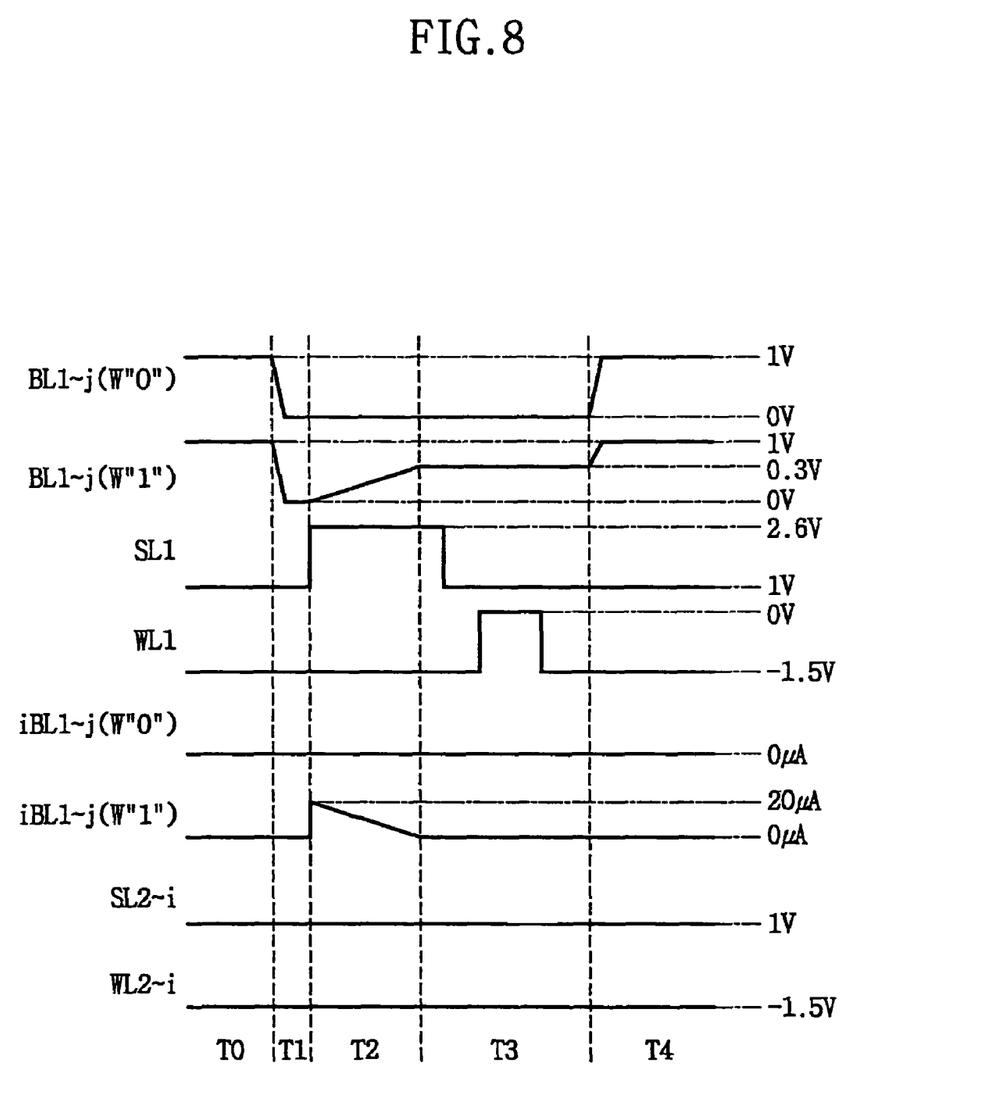
FIG. 8 is a timing diagram illustrating still another example embodiment of the read operation of the semiconductor memory device shown in FIG. 3.

FIG. 8 is a timing diagram illustrating still another example embodiment of the read operation of the semiconductor memory device shown in FIG. 3, showing a case in which the read operation may be coincidentally performed on the memory cells MC11 to MC1j connected in common to the word line WL1 and the source line SL1. SL1, WL1, BL2 to BLj, SL2 to SL1 and WL2 to WLi in FIG. 8 are the same as those described in FIG. 4. In FIG. 8, BL1~j(W"0") denotes a voltage of the bit line BL1 connected to the memory cell MC11 storing data "0". BL1~j(W"1") denotes a voltage of a bit line connected to a memory cell storing data "1." iBL1~j (W"0") denotes a bipolar current flowing through the memory cell storing data "0" and a bit line connected thereto, while iBL1~j(W"1") denotes a bipolar current flowing through the memory cell storing data "1" and a bit line connected thereto.

Now, still another example embodiment of the read operation in the capacitorless semiconductor memory device will be described with reference to FIGS. 1 through 3, FIG. 5 and FIG. 8.

This read operation of the semiconductor memory device may be similar to that mentioned above with reference to FIG. 6, except that the column controller 30 precharges all of the bit lines BL1 to BLj to a required or predetermined voltage (e.g., 0 V) in period T1. After precharging, the bit lines BL1 to BLj may be electrically floated.

Operations of periods T0, T2, T3 and T4 will be appreciated by referring to the former description of FIG. 6.

Although not shown, the column controller 30 may include sense amplifiers for sensing and amplifying data of bit lines during period T3 of FIG. 6 or 8 in the read operation. For the read operation as shown in FIG. 6 or 7, the sense amplifiers may be disposed in correspondence with a required or predetermined number of the bit lines. Otherwise, for the read operation as shown in FIG. 8, the sense amplifiers may be prepared with respect to all of the bit lines.

As described above, since the capacitorless semiconductor memory device and operating method thereof according to the example embodiments are capable of performing the data read and restoration by simply controlling the word and source lines, there is no need to prepare an additional circuit for the data restoration.

A semiconductor memory device having capacitorless dynamic memory cells according to example embodiments need not prepare a write-back path and may easily restore data by controlling word and source lines.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor memory device, comprising:
   a memory cell array including a plurality of memory cells coupled between a plurality of word lines, a plurality of source lines and a plurality of bit lines, each memory cell including a transistor having a floating body; and
   a controller configured to,
   read data from at least one of the memory cells during a read operation, while (1) restoring first data to a first memory cell storing a first data state during a first period of the read operation and (2) restoring second data to a second memory cell storing a second data state during a second period of the read operation.

2. The semiconductor memory device according to claim 1, wherein the first data state is a logical 1 and the second data state is a logical 0.

3. The semiconductor memory device according to claim 1, wherein the controller is configured to restore the first data to the first memory cell, which is storing the first data state, by a bipolar current induced through a bipolar junction transistor operation during the first period and restores the second data to the second memory cell, which is storing the second data state, by a coupling effect during the second period.

4. The semiconductor memory device according to claim 1, wherein
   the controller is configured to restore the first data to the first memory cell, which is storing the first data state, by applying a first source-line control voltage to a selected source line and applying a first word-line control voltage to a selected word line in the first period of the read operation, and
   the controller is configured to restore the second data to the second memory cell, which is storing the second data state, by applying a second source-line control voltage to the selected source line and applying a second word-line control voltage to the selected word line in the second period of the read operation.

5. The semiconductor memory device according to claim 4, wherein the second source-line control voltage is lower than the first source-line control voltage and the second word-line control voltage is higher than the first word-line control voltage.

6. The semiconductor memory device according to claim 4, wherein the controller is configured to charge the bit lines to a voltage before the first period of the read operation.

7. The semiconductor memory device according to claim 6, wherein the controller is configured to electrically float the bit lines during the first period of the read operation.

8. The semiconductor memory device according to claim 4, wherein the controller is configured to charge at least one selected bit line to a charge voltage before the first period of the read operation.

9. The semiconductor memory device according to claim 8, wherein the controller is configured to electrically float the selected bit line during the first period and applies a data retention voltage to unselected bit lines during the first and second periods.

10. The semiconductor memory device according to claim 9, wherein the data retention voltage is the same as the second source-line control voltage and the charge voltage is lower than the data retention voltage.

11. The semiconductor memory device according to claim 4, wherein the controller is configured to apply one of a first and second write voltage to at least one of the bit lines for storing one of the first and second data states in one of the first and second memory cells, apply the first source-line control voltage to the selected source line, and apply a third word-line control voltage to the selected word line, in sequence during a write operation.

12. The semiconductor memory device according to claim 11, wherein the second word-line control voltage is the same as the third word-line control voltage.

13. The semiconductor memory device according to claim 11, wherein the second word-line control voltage is lower than the third word-line control voltage.

14. The semiconductor memory device according to claim 11, wherein, during an operation of data retention, the controller is configured to apply a data retention voltage to a selected bit line, apply the second source-line control voltage to the selected source line, and apply a fourth word-line control voltage to the selected word line.

15. The semiconductor memory device according to claim 14, wherein the first word-line control voltage is the same as the fourth word-line control voltage.

16. The semiconductor memory device according to claim 14, wherein the first word-line control voltage is higher than the fourth word-line control voltage but lower than the third word-line control voltage.

17. The semiconductor memory device according to claim 16, wherein the controller is configured to apply the first word-line control voltage, the fourth word-line control voltage and the second word-line control voltage in sequence to the selected word line during the second period.

18. The semiconductor memory device according to claim 14, wherein the data retention voltage applied to the selected bit line is the same as the second source-line control voltage, the second write voltage is lower than the data retention voltage, and the first write voltage is lower than the second write voltage.

19. A method for operating a semiconductor memory device including a memory cell array having a plurality of memory cells coupled between a plurality of word lines, a plurality of source lines and a plurality of bit lines, each memory cell including a transistor having a floating body, the method comprising:
reading data from at least one of the memory cells during a read operation, while (1) restoring first data to a first memory cell storing a first data state during a first period of the read operation and (2) restoring second data to a second memory cell storing a second data state during a second period of the read operation.

20. The method according to claim 19, wherein
the restoring first data to a first memory cell step restores the first data by a bipolar current through a bipolar junction transistor operation during the first period, and
the restoring second data to a second memory cell step restores the second data by a coupling effect during the second period.

21. The method according to claim 19, wherein
the restoring first data to a first memory cell step restores the first data, by applying a first source line control voltage to a selected source line and applying a first word-line control voltage to a selected word line in the first period of the read operation, and
the restoring second data to the second memory cell step restores the second data, by applying a second source-line control voltage to the selected source line and applying a second word-line control voltage to the selected word line in the second period of the read operation.

22. The method according to claim 21, further comprising:
writing data to the memory cell by applying one of a first and second write voltage to at least one of the bit lines for storing one of the first and second data states in the memory cell, applying the first source-line control voltage to the selected source line, and applying a third word-line control voltage to the selected word line in a write operation.

23. The method according to claim 22, wherein the writing data to the memory cell comprises:
applying one of the first and second write voltages to a selected bit line;
applying the first source-line control voltage to the selected source line;
applying the third word-line control voltage to the selected word line;
applying a fourth word-line control voltage, which is lower than the third word-line control voltage, to the selected word line;
applying the second source-line control voltage, which is lower than the first source-line control voltage, to the selected source line; and
applying a data retention voltage to the bit lines.

24. The method according to claim 22, wherein the second word-line control voltage is equal to or lower than the third word-line control voltage.

25. The method according to claim 22, further comprising:
retaining data of the memory cells by applying a data retention voltage to the bit lines in an operation of data retention, applying the second source-line control voltage to the source lines and applying a fourth word-line control voltage to the word lines.

26. The method according to claim 25, wherein the first word-line control voltage is the same as the fourth word-line control voltage.

27. The method according to claim 25, wherein the first word-line control voltage is higher than the fourth word-line control voltage and lower than the third word-line control voltage.

28. The method according to claim 27, wherein the restoring second data to a second memory cell step comprises:
applying the second source-line control voltage to the selected source line and applying the fourth word-line control voltage to the selected word line;
applying the second word-line control voltage to the selected word line; and
applying the fourth word-line control voltage to the selected word line.

29. The method according to claim 28, wherein the data retention voltage is the same as the second source-line control voltage, the second write voltage is lower than the data retention voltage, and the first write voltage is lower than the second write voltage.

30. The method according to claim 19, further comprising:
charging at least one selected bit line to a charge voltage before the first period of the read operation;
electrically floating the selected bit lines during the first period; and
applying a data retention voltage to unselected bit lines during the first and second periods.

* * * * *